United States Patent
Lee et al.

(10) Patent No.: US 8,116,164 B2
(45) Date of Patent: Feb. 14, 2012

(54) SEMICONDUCTOR MEMORY DEVICE

(75) Inventors: Chang-Yong Lee, Suwon-si (KR);
Gongheum Han, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 266 days.

(21) Appl. No.: 12/621,014

(22) Filed: Nov. 18, 2009

(65) Prior Publication Data
US 2010/0177584 A1    Jul. 15, 2010

(30) Foreign Application Priority Data
Jan. 14, 2009  (KR) .......................... 10-2009-0003101

(51) Int. Cl.
*G11C 8/00* (2006.01)

(52) U.S. Cl. ......... 365/230.03; 365/189.04; 365/189.17; 365/226

(58) Field of Classification Search ............. 365/189.04, 365/189.17, 226, 230.03
See application file for complete search history.

(56) References Cited

U.S. PATENT DOCUMENTS

| | | | |
|---|---|---|---|
| 5,150,330 A * | 9/1992 | Hag ..................... | 365/230.03 |
| 6,611,466 B2 | 8/2003 | Lee et al. | |
| 7,106,612 B2 | 9/2006 | Kim | |
| 7,499,367 B2 | 3/2009 | Park | |
| 2003/0002358 A1 | 1/2003 | Lee et al. | |
| 2005/0169079 A1 | 8/2005 | Kim | |
| 2008/0002478 A1 | 1/2008 | Park | |
| 2008/0159018 A1 | 7/2008 | Matano | |
| 2008/0159048 A1 | 7/2008 | Matano | |

FOREIGN PATENT DOCUMENTS

| | | |
|---|---|---|
| JP | 2008-159128 A | 7/2008 |
| JP | 2008-159145 A | 7/2008 |
| KR | 10-2003-0003778 A | 1/2003 |
| KR | 10-2005-0078272 A | 8/2005 |
| KR | 10-0790446 A | 12/2007 |

* cited by examiner

*Primary Examiner* — Hoai V Ho
(74) *Attorney, Agent, or Firm* — Sughrue Mion, PLLC

(57) ABSTRACT

A semiconductor memory device includes a plurality of banks; a peripheral circuit configured to send data to and receive data from the plurality of banks; and data lines configured to connect the plurality of banks and the peripheral circuit, wherein the plurality of banks are disposed such that a sum of lengths of data transfer paths of the data lines connecting the peripheral circuit and at least two banks, among the plurality of banks, activated at a same time is uniformly maintained.

17 Claims, 9 Drawing Sheets

SEMICONDUCTOR MEMORY DEVICE

CROSS-REFERENCE TO RELATED APPLICATIONS

This application claims priority from Korean Patent Application No. 10-2009-0003101 filed on Jan. 14, 2009, the disclosure of which is incorporated herein in its entirety by reference.

SUMMARY

The inventive concept relates to a semiconductor memory device.

A semiconductor memory device may have an array of individual memory cells. The array may be formed of a plurality of rows and a plurality of columns, and intersections of the rows and the columns may be defined by memory cell addresses, respectively. For example, each of the memory cells may be formed of a capacitor for storing a charge and a transistor for accessing the capacitor to change or sense the charge of the capacitor. The charge may express a data bit as a high voltage indicating logic '1' or as a low voltage indicating logic '0'. Data may be stored in a memory at a write operation or read out from a memory at a read operation.

A read operation of a semiconductor memory device may be accomplished by activating a word line and connecting memory cells in the selected word line with bit lines. If a word line is activated, a sense amplifier may sense and amplify data from memory cells in the activated word line via bit lines. A semiconductor memory device may select a row and a column to access a memory cell defined by the selected row and column. The sense amplifier may determine whether the selected memory cell stores data '1' or data '0'.

To improve an access speed and a cycle time of a semiconductor memory device, a bank architecture may be considered which is capable of reducing capacitive loads of word lines by shortening lengths of the word lines. That is, memory cells of a semiconductor memory device are arranged in a bank unit to form a plurality of banks, and the semiconductor memory device operates in a bank unit.

The number of banks in a memory, e.g., a graphic memory, has been increased continuously under the condition that its power is limited. For this reason, a memory with eight or more banks may require a bank architecture considering power consumption.

One aspect of an exemplary embodiment is directed to a semiconductor memory device which includes a plurality of banks; a peripheral circuit configured to send data to and receive data from the plurality of banks; and data lines configured to connect the plurality of banks and the peripheral circuit, wherein the plurality of banks are disposed such that a sum of lengths of data transfer paths of data lines connecting the peripheral circuit and at least two banks activated at the same time is uniformly maintained.

Another aspect of exemplary embodiments is directed to a semiconductor memory device which comprises at least two chips, each chip including a plurality of bank groups, each including a plurality of banks, and configured to activate at least two banks of the plurality of banks at a same time in response to an input address; and a peripheral circuit disposed between the at least two chips and configured to interface data via data lines shared by the plurality of bank groups of the at least two chips, wherein the at least two chips are driven independently, and wherein when at least two banks in at least one of the at least two chips are activated, a sum of lengths of data transfer paths of data lines between the peripheral circuit and the activated banks may be constantly maintained to improve an alternating current (AC) characteristic of the semiconductor memory device. Alternatively, the peripheral circuit may include internal power supply circuits for supplying power to the banks of the at least two chips. When at least two banks in at least one of the at least two chips are activated, a sum of lengths of power supply paths between the peripheral circuit and the activated banks may be constantly maintained to improve the AC characteristic of the semiconductor device.

BRIEF DESCRIPTION OF THE DRAWINGS

Non-limiting and non-exhaustive embodiments will be described with reference to the following drawings, wherein like reference numerals refer to like parts throughout the various figures unless otherwise specified. In the drawings.

DETAILED DESCRIPTION OF EXEMPLARY EMBODIMENTS

A semiconductor memory device of exemplary embodiments of the inventive concept may be configured such that at least two banks are activated at the same time by an input address and that there is constantly maintained a sum of lengths (or data transfer paths) of data lines between the activated banks and a peripheral circuit or that there is constantly maintained a sum of lengths (or power supply paths) between the activated banks and internal power circuits of a peripheral circuit. With this bank architecture, a power consumption may be maintained uniformly in driving the semiconductor memory device, so that an AC characteristic of the semiconductor memory device is improved.

Figure 1:
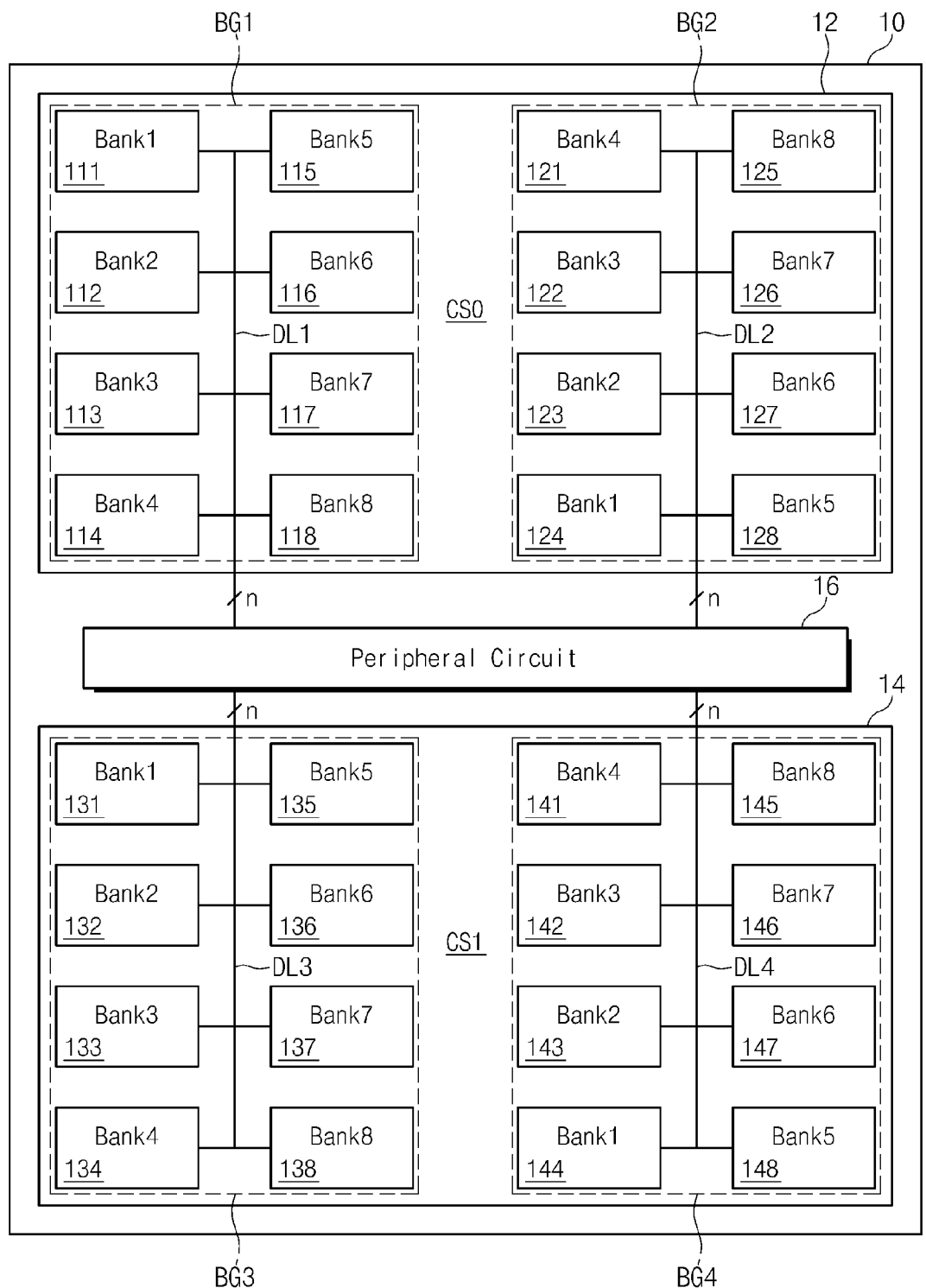
FIG. 1 is a diagram illustrating a semiconductor memory device according to an exemplary embodiment.

FIG. 1 is a diagram illustrating a semiconductor memory device according to an exemplary embodiment.

Referring to FIG. 1, a semiconductor memory device 10 may include a first chip 12, a second chip 14, and a peripheral circuit 16. Herein, the first and second chips 12 and 14 and the peripheral circuit 16 may be integrated in a single chip. Alternatively, the first and second chips 12 and 14 and the peripheral circuit 16 may be configured to be included in one package as an individual chip. However, configurations of elements of the semiconductor memory device 10 are not limited to this disclosure. The first chip 12 may include two bank groups BG1 and BG2. The second chip 14 may include two bank groups BG3 and BG4. The semiconductor memory device 10 may be constructed such that at least two banks are activated at the same time. The activated banks may be included in different bank groups, respectively.

In an exemplary embodiment, the semiconductor memory device 10 may be constructed such that at least two banks are activated simultaneously by an input address (for example, including a bank address).

The first chip 12 may include the first and second bank groups BG1 and BG2. The first bank BG1 has eight banks 111-118, and the second bank group BG2 has eight banks 121-128. The banks 111-118 of the first bank group BG1 may be arranged to share a plurality of data lines DL1 (for example, N data lines where N is a positive integer). For example, four banks 111-114 are disposed at a left side of the data lines DL1, and four banks 115-118 are disposed at a right side of the data lines DL1. The banks 121-128 of the second bank group BG2 may be arranged to share a plurality of data lines DL2 (for example, N data lines where N is a positive integer). For example, four banks 121-124 are disposed at a left side of the data lines DL2 and four banks 125-128 are disposed at a right side of the data lines DL2.

In an exemplary embodiment, when the first chip 12 is selected (or activated), two banks may be selected (or activated) at the same time according to an input address (for example, a bank address). For example, when the first chip 12 is selected, one bank 111 in the first bank group BG1 and one bank 124 in the second bank group BG2 may be selected (or activated) at the same time according to an input address. As illustrated in FIG. 1, each of the selected banks 111 and 124 is designated as first bank "Bank1". This means that the banks 111 and 124 are selected at the same time by the input address (for example, including a bank address). Alternatively, when the first chip 12 is selected, one bank 113 in the first bank group BG1 and one bank 122 in the second bank group BG2 may be selected (or activated) at the same time according to an input address. As illustrated in FIG. 1, each of the selected banks 113 and 122 is designated as a third bank "Bank3". Remaining banks may be selected in the same manner as described above.

The second chip 14 may include the third and fourth bank groups BG3 and BG4. The third bank BG3 has eight banks 131-138, and the fourth bank group BG4 has eight banks 141-148. The banks 131-138 of the third bank group BG3 may be arranged to share a plurality of, for example, N data lines DL3. For example, four banks 131-134 are disposed at a right side of the data lines DL3, and four banks 135-138 are disposed at a left side of the data lines DL3. The banks 141-148 of the fourth bank group BG4 may be arranged to share a plurality of, for example, N data lines DL4. For example, four banks 141-144 are disposed at a left side of the data lines DL4 and four banks 145-148 are disposed at a right side of the data lines DL4.

In an exemplary embodiment, when the second chip 14 is selected, two banks may be selected (or activated) at the same time according to an input address (for example, a bank address). For example, when the second chip 14 is selected, one bank 131 in the third bank group BG3 and one bank 144 in the fourth bank group BG4 may be selected (or activated) at the same time according to an input address. As illustrated in FIG. 1, the selected banks 131 and 144 are labeled as "Bank1". Alternatively, when the second chip 14 is selected, one bank 133 in the third bank group BG3 and one bank 142 in the fourth bank group BG4 may be selected (or activated) at the same time according to an input address. As illustrated in FIG. 1, the selected banks 133 and 142 are labeled as "Bank3" Remaining banks may be selected in the same manner as described above.

As illustrated in FIG. 1, banks 131-138 of the third bank group BG3 may be disposed in a shifted arrangement with respect to banks 111-118 of the first bank group BG1, not in a mirror arrangement on the basis of the peripheral circuit 16. Likewise, banks 141-148 of the fourth bank group BG4 may be disposed in a shifted arrangement with respect to banks 121-128 of the second bank group BG2, not in a mirror arrangement on the basis of the peripheral circuit 16. Further, the banks 121-128 of the second bank group BG2 may be disposed in a reversed and shifted arrangement with respect to the banks 111-118 of the first bank group BG1. Likewise, the banks 141-148 of the fourth bank group BG4 may be disposed in a reversed and shifted arrangement with respect to the banks 131-138 of the third bank group BG3. The bank architecture is not limited to this disclosure. For example, although not shown in the drawings of the present application, it is possible to dispose odd-numbered banks (for example, Bank1, Bank3, Bank5, and Bank7) at a right/left side of the data lines DL1 and even-numbered banks (for example, Bank2, Bank4, Bank6, and Bank8) at a left/right side of the data lines DL1. In this case, remaining bank groups are also configured to have the same bank architecture as above described.

The banks 111-118, 121-128, 131-138, and 141-148 of the bank groups BG1-BG4 may be formed on one substrate or formed to have a stack structure. In a case where the banks 111-118, 121-128, 131-138, and 141-148 are formed to have a stack structure, for example, banks 111-114 are formed to have a stack structure and banks 115-118 are formed to have a stack structure. In this case, the data lines DL1 may be disposed between the stacked banks 111-114 and the stacked banks 115-118.

As will be described below, each of the banks 111-118, 121-128, 131-138, and 141-148 may be configured to have a memory core. Each of the banks 111-118, 121-128, 131-138, and 141-148 may be formed to have a capacity of 32 Mb. In this case, each of the bank groups BG1-BG4 may have a capacity of 256 Mb, and each of the chips 12 and 14 may have a capacity of 512 Mb. But, it is well understood that a capacity of the bank is not limited to 32 Mb.

The semiconductor memory device 10 may be configured such that one of the first and second chips 12 and 14 is activated according to an input address or a chip select signal.

For example, it is assumed that chip activation is selected according to an address pin A12. In accordance with this assumption, the first chip 12 is activated when addresses A0-A11 are received, and the second chip 14 is activated when addresses A0-A12 are received. Alternatively, it is possible to select chip activation using a chip select pin.

The semiconductor memory device 10 may be configured so that when at least one of the first and second chips 12 and 14 is activated, one of banks of each bank group is activated in the activated chip. For example, when the first chip 12 is activated, one of banks 111-118 in the first bank group BG1 and one of banks 121-128 in the second bank group BG2 may be activated simultaneously. Likewise, when the second chip 14 is activated, one of banks 131-138 in the third bank group BG3 and one of banks 141-148 in the fourth bank group BG4 may be activated simultaneously.

Figure 2:
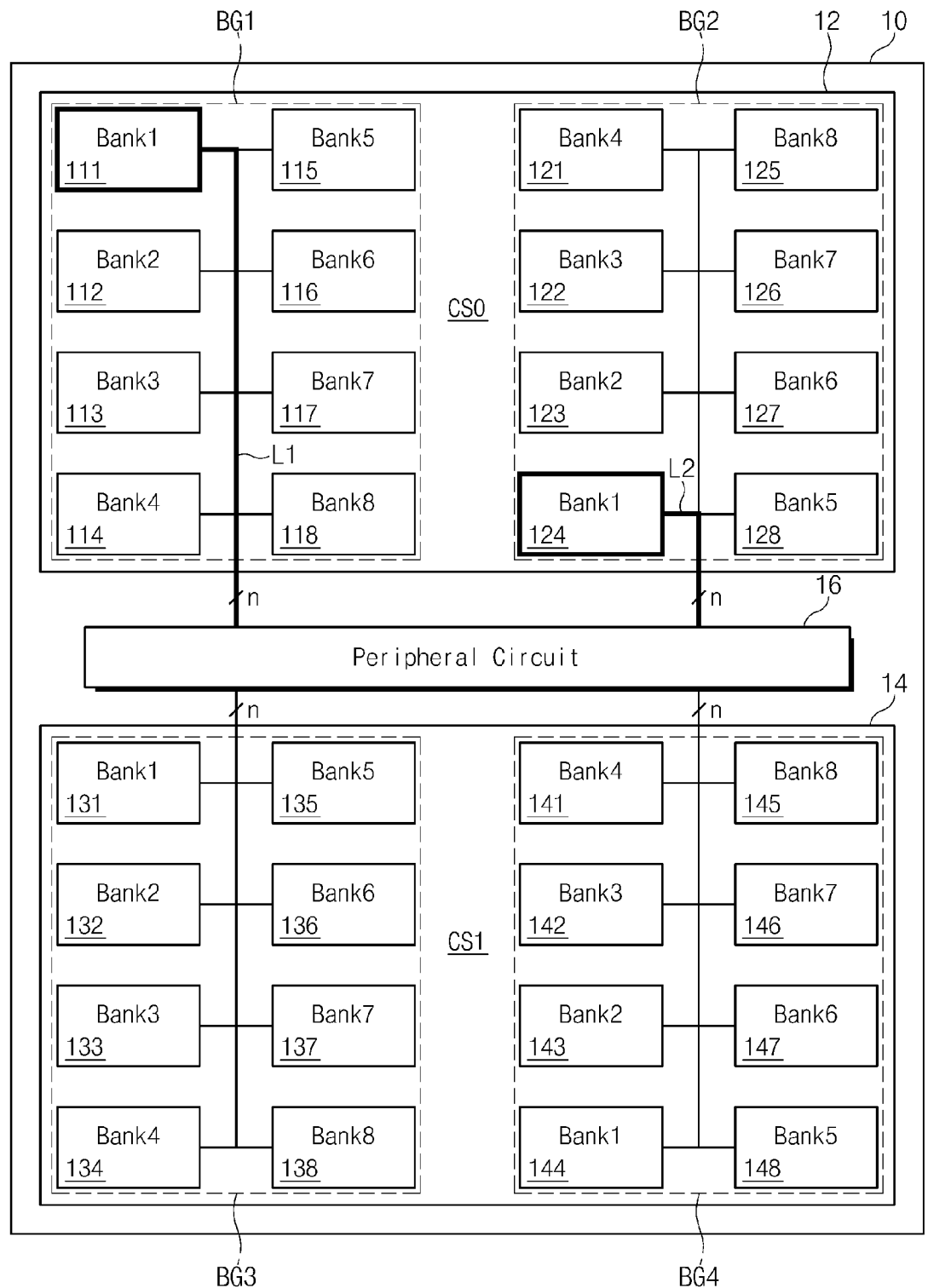
FIG. 2 is a diagram illustrating a case in which first banks in the first chip as shown in FIG. 1 are activated, according to an exemplary embodiment.

Referring to FIG. 2 which illustrates a case in which two first banks in the first chip are activated, i.e., the first bank 111 of the first bank group BG1 and the first bank 124 of the second bank group BG2 are activated at the same time according to an input address (for example, a bank address). Alternatively, referring to FIG. 3 which illustrates a case in which two third banks in the first chip are activated, i.e., the third bank 113 of the first bank group BG1 and the third bank 122 of the second bank group BG2 are activated at the same time according to an input address (for example, a bank address).

Figure 3:
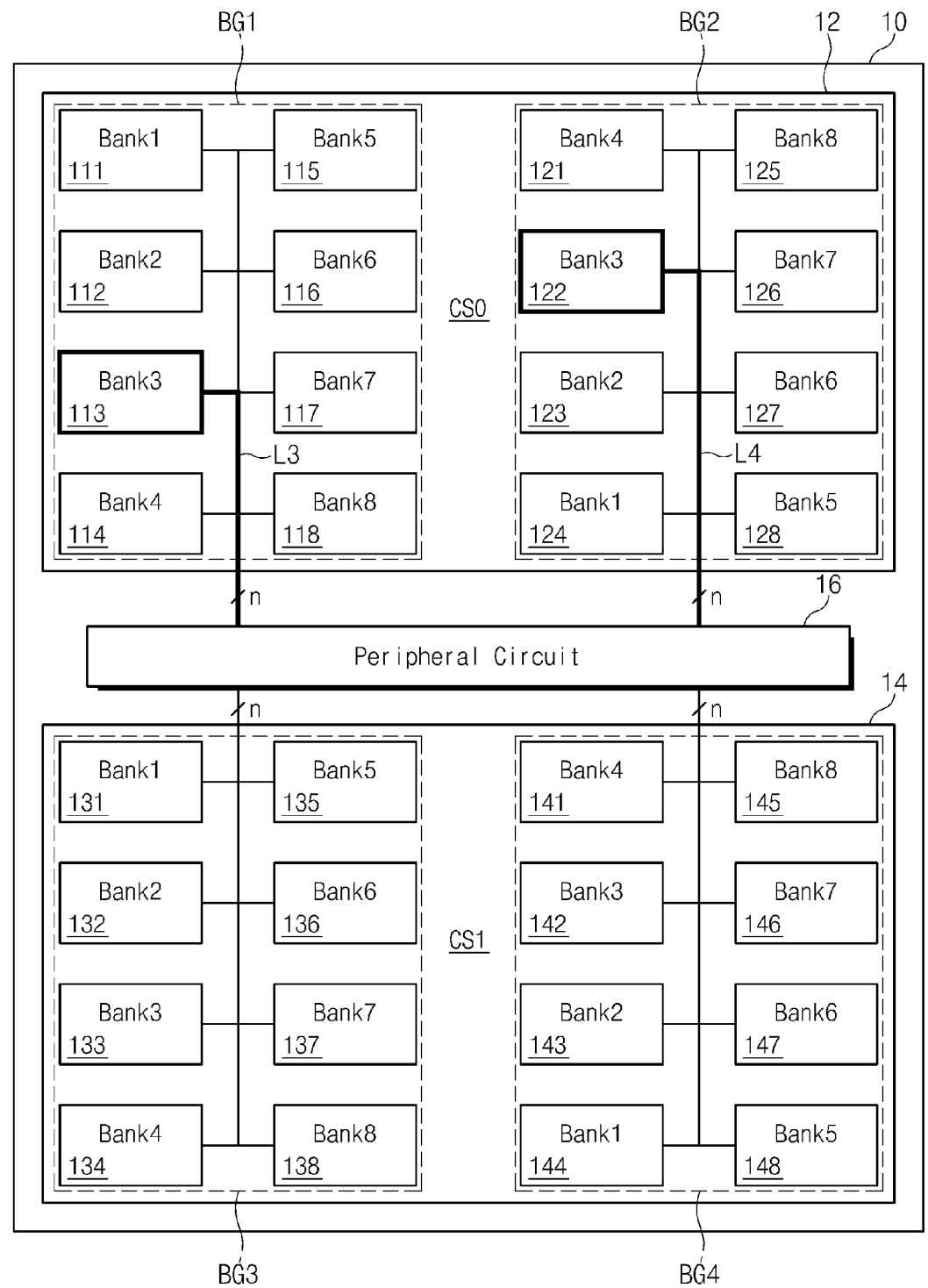
FIG. 3 is a diagram illustrating a case in which third banks in the first chip as shown in FIG. 1 are activated, according to an exemplary embodiment.

For example, referring to FIGS. 2 and 3, a sum (L1 and L2) of a length L1 (or, a data transfer path of data lines) between the first bank 111 of the first bank group BG1 and the peripheral circuit 16 and a length L2 between the first bank 124 of the second bank group BG2 and the peripheral circuit 16 may be identical to a sum (L3 and L4) of a length L3 between the third bank 113 of the first bank group BG1 and the peripheral circuit 16 and a length L4 between the third bank 122 of the second bank group BG2 and the peripheral circuit 16. Herein, the length between a selected bank and the peripheral circuit 16 may indicate a length of a data transfer path between the selected bank and the peripheral circuit 16.

In particular, the semiconductor memory device 10 may be configured such that whenever two banks are activated at the same time, a sum of data transfer paths between simultaneously activated banks and a peripheral circuit 16 is maintained to be constant (or similar). This enables constant power consumption whenever two banks are activated at the same time. Thus, the AC characteristic of the semiconductor memory device 10 may be improved.

Figure 4:
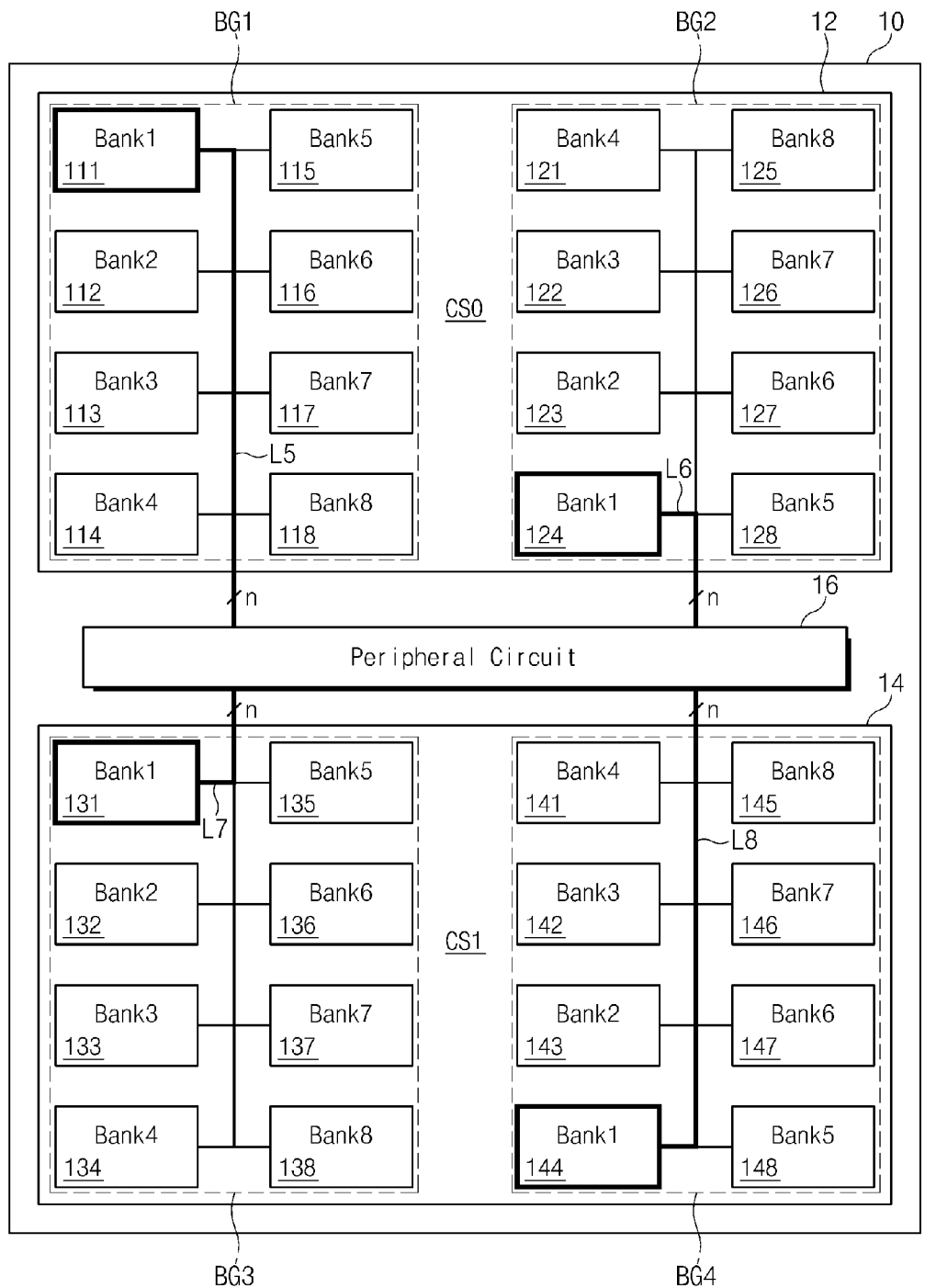
FIG. 4 is a diagram illustrating a case in which the first banks in the first and second chips as shown in FIG. 1 are activated, according to an exemplary embodiment.
Figure 5:
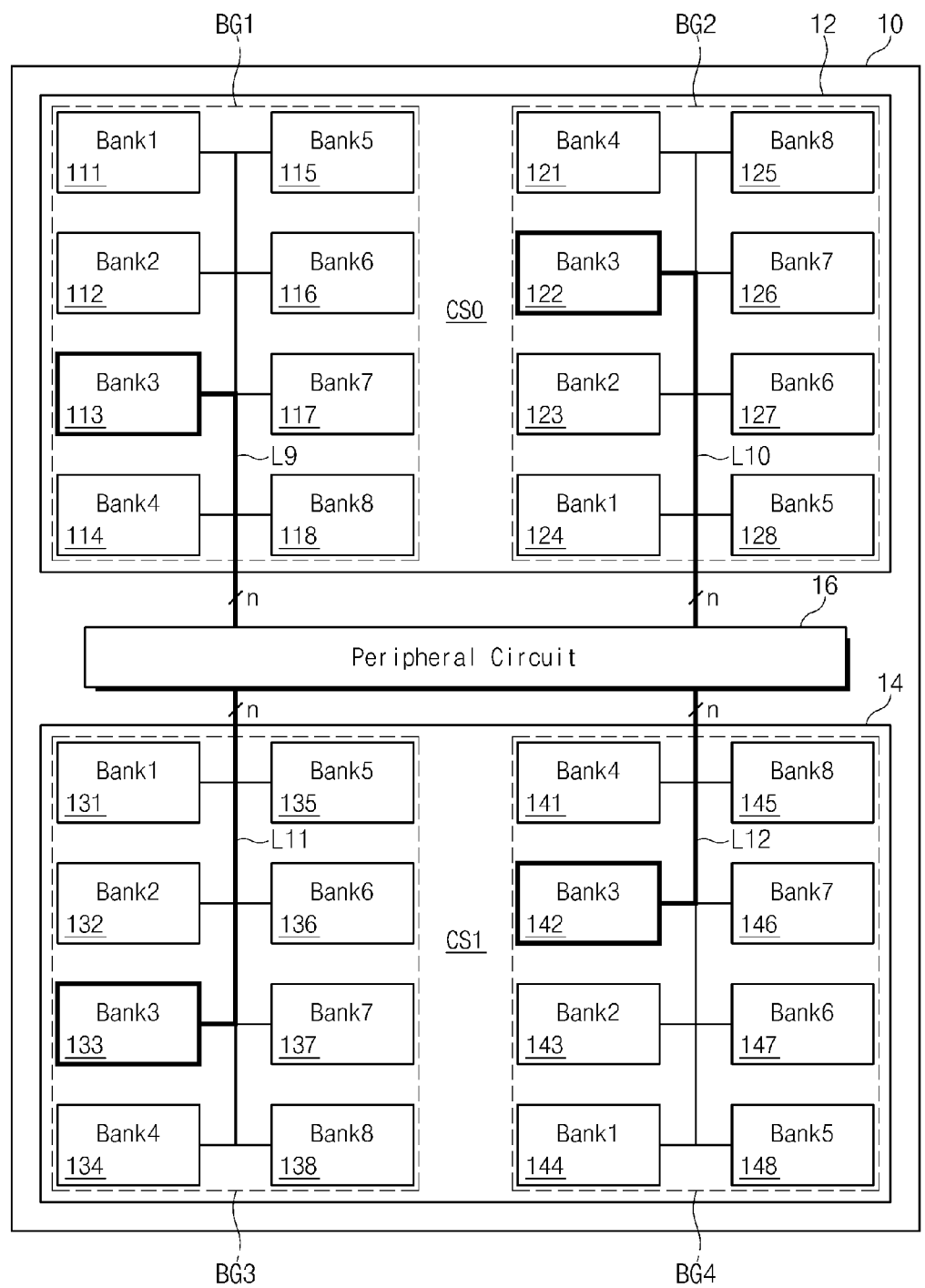
FIG. 5 is a diagram illustrating a case in which the third banks in the first and second chips as shown in FIG. 1 are activated, according to an exemplary embodiment.

An event that the first and second chips 12 and 14 are selected (or activated) at the same time will be described with reference to FIGS. 4 and 5. Referring to FIGS. 4 and 5 which illustrate cases in which the first banks (Bank1s) in the first and second chips are activated and that the third banks (Bank3s) in the first and second chips are activated, a sum (L5+L6+L7+L8) of a length L5 between the first bank 111 of the first bank group BG1 and the peripheral circuit 16, a length L6 between the first bank 124 of the second bank group BG2 and the peripheral circuit 16, a length L7 between the first bank 131 of the third bank group BG3 and the peripheral circuit 16, and a length L8 between the first bank 144 of the fourth bank group BG4 and the peripheral circuit 16, may be identical to a sum (L9+L10+L11+L12) of a length L9 between the third bank 113 of the first bank group BG1 and the peripheral circuit 16, a length L10 between the third bank 122 of the second bank group BG2 and the peripheral circuit 16, a length L11 between the third bank 133 of the third bank group BG3 and the peripheral circuit 16, and a length L12 between the third bank 142 of the fourth bank group BG4 and the peripheral circuit 16.

In an exemplary embodiment, in the event that the first and second chips 12 and 14 are selected simultaneously, four banks activated respectively in the first to fourth bank groups BG1-BG4 may be accessed by an input address (for example, a bank address). Alternatively, in the event that one of the first and second chips 12 and 14 is selected, two banks activated respectively in two bank groups of the selected chip may be accessed by an input address (for example, a bank address).

As described above, it is possible to maintain an amount of consumed current to be constant by disposing banks so that a total of data transfer paths related to activated banks is always maintained to be constant (or similar). Accordingly, the semiconductor memory device of an exemplary embodiment of the inventive concept has a constant AC characteristic.

The inventive concept is described under the condition that a total of data transfer paths related to activated banks is always maintained constantly. However, it is well understood that it is possible to make the semiconductor memory device 10 such that a total of data transfer paths related to activated banks is maintained similarly.

The peripheral circuit 16 may be disposed between the first chip 12 and the second chip 14 and at the center of the semiconductor memory device 10. Although not shown in the drawings, the peripheral circuit 16 may include a decoder circuit, a buffer circuit, a power supply circuit, a data input/output circuit, input/output pads, and the like.

Figure 6:
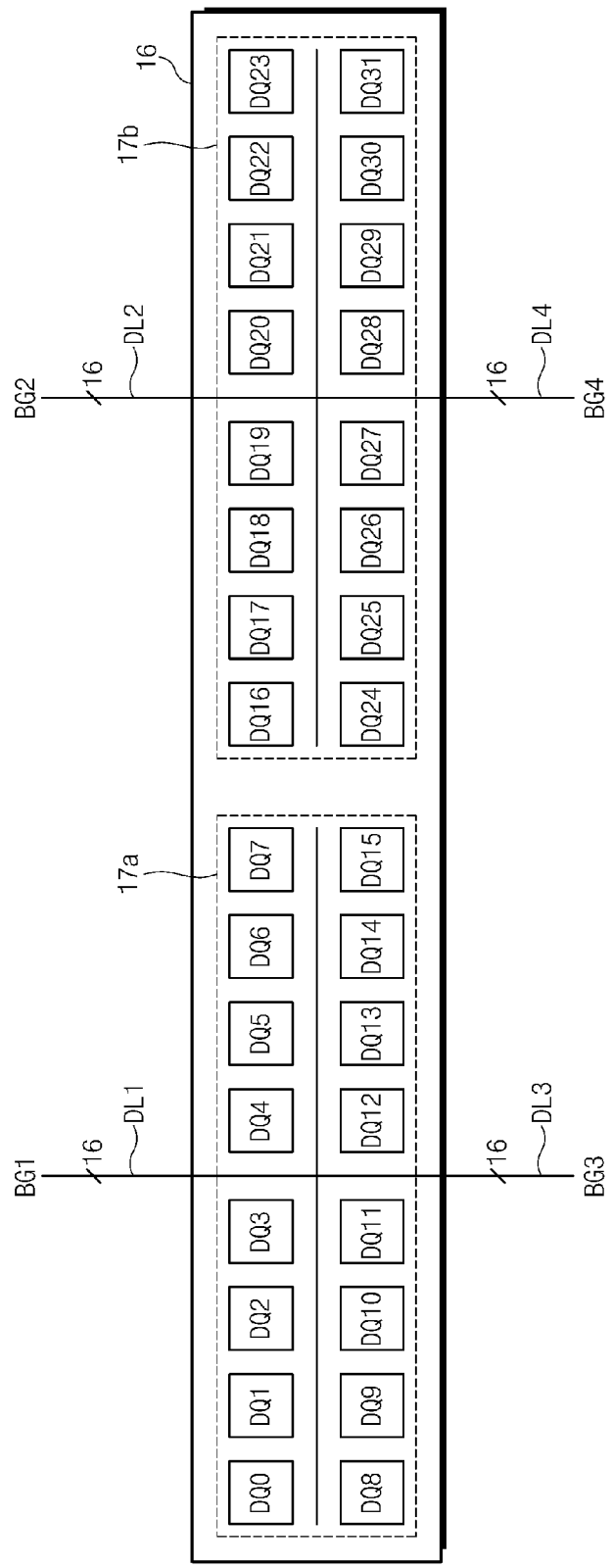
FIG. 6 is a diagram illustrating data input/output pads of the semiconductor memory device illustrated in FIG. 1, according to an exemplary embodiment.

FIG. 6 is a diagram illustrating data input/output pads of the semiconductor memory device 10 illustrated in FIG. 1, according to an exemplary embodiment.

A peripheral circuit 16 may include a first input/output pad section 17a and a second input/output pad section 17b. The first input/output pad section 17a may include 16 input/output pads DQ0-DQ15 which are connected with the data lines DL1 shared by the banks 111-118 of the first bank group BG1 and with the data lines DL3 shared by the banks 131-138 of the third bank group BG3. The second input/output pad section 17b may include 16 input/output pads DQ16-DQ31 which are connected with the data lines DL2 shared by the banks 121-128 of the second bank group BG2 and with the data lines DL4 shared by the banks 141-148 of the fourth bank group BG4.

In FIG. 6, there is illustrated the peripheral circuit 16 which includes two input/output pad sections 17a and 17b so as to be applied to a 32-bit structure. However, the inventive concept may be applied to a 64-bit structure. In this case, the peripheral circuit 16 may include 64 input/output pads.

The banks of the semiconductor memory device 10 may be configured to include a dynamic random access memory (DRAM) core, respectively, according to an exemplary embodiment.

Figure 7:
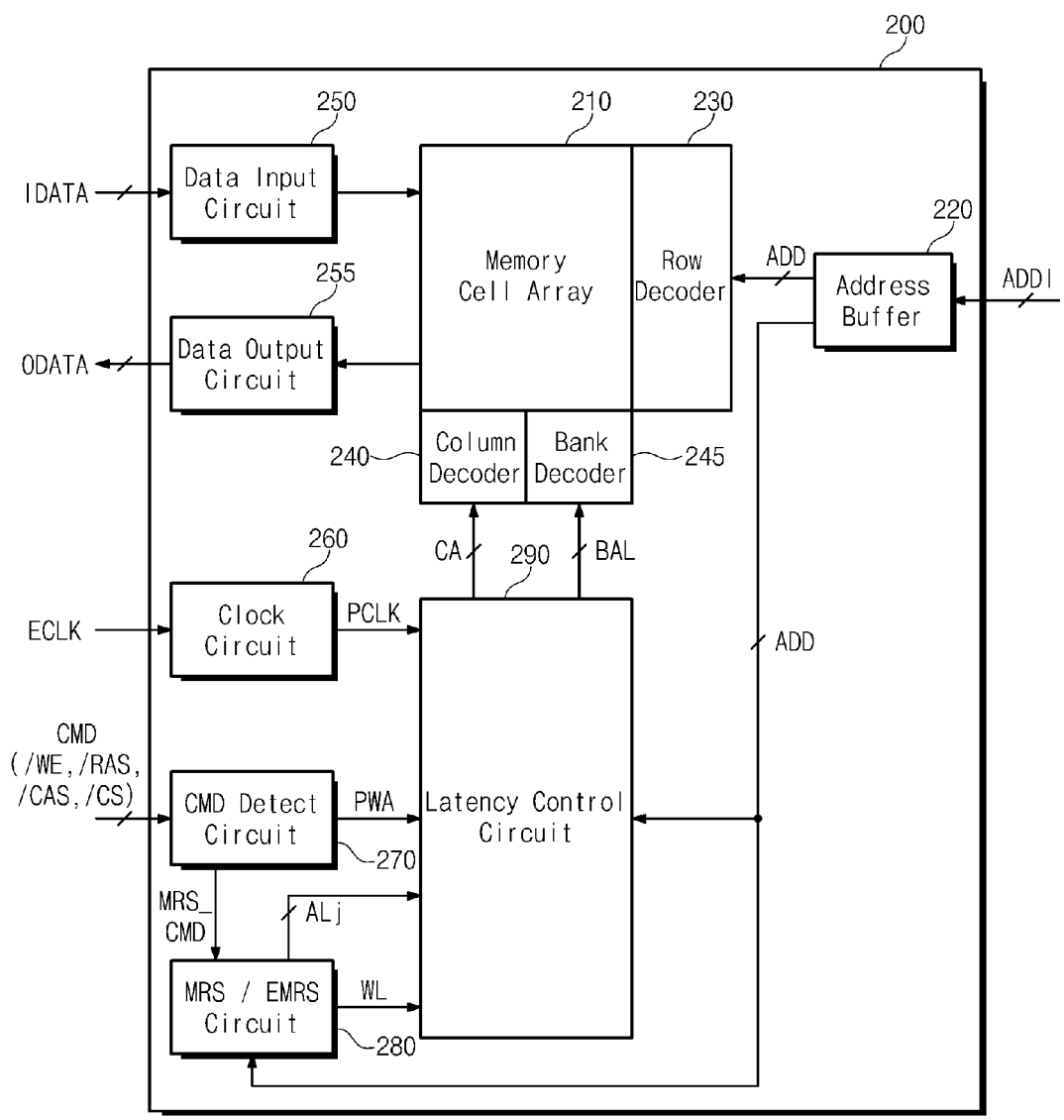
FIG. 7 is a block diagram illustrating one of the banks shown in FIG. 1, according to an exemplary embodiment.

FIG. 7 is a block diagram illustrating one of the banks shown in FIG. 1, according to an exemplary embodiment.

Each of the banks of the semiconductor memory device 10 may be configured to include a memory core 200 illustrated in FIG. 7. The memory core 200 may include a memory cell array 210, an address buffer 220, a row decoder 230, a column decoder 240, a bank decoder 245, a data input circuit 250, a data output circuit 255, a clock circuit 260, a command detect circuit 270, a mode register set (MRS)/extended mode register set (EMRS) circuit 280, and a latency control circuit 290.

The memory cell array 210 may include a plurality of memory cells arranged at intersections of word lines and bit lines. Data IDATA received via the data input circuit 250 may be written in the memory cell array 210 according to an address signal ADDI. Data ODATA read out from the memory cell array 210 according to the address signal ADDI may be output to the shared data lines, such as DL1-DL4 (refer to FIG. 1), via the data output circuit 255. The address buffer 220 may receive the address signal ADDI for appointing memory cells at a read or write operation and temporarily store the received address ADDI.

The row decoder 230 may decode a row address of the address signal ADD output from the address buffer 220. The column decoder 240 may decode a column address CA from the latency control circuit 290. The bank decoder 245 may decode a bank address signal BAL from the latency control circuit 290. In the event that a bank is activated according to a bank address, the memory cell array 210 of the activated bank may store or read data in or from memory cells selected by row and column addresses.

The clock circuit 260 may generate an internal clock signal PCLK in response to an external clock signal ECLK. Herein, the internal clock signal PCLK may be a buffered version of the external clock signal ECLK.

The command detect circuit 270 may decode an externally applied command signal CMD (for example, received signals /WE, /RAS, /CAS, /CS) and generate a command signal (for example, PWA) as a decoded result. Although not illustrated in the drawings, the command detect circuit 270 may include a command buffer and a command decoder.

The MRS/EMRS circuit 280 may be configured to set internal mode registers in response to the address signal ADD and an MRS/EMRS command MRS_CMD for appointing a mode of operation of a memory bank. Input latency, that is, write latency WL and additional latency ALi (i being a positive integer), may be set in mode registers according to the MRS/EMRS command MRS_CMD. The MRS/EMRS circuit 280 may output a write latency signal WLi according to set write latency information and an additional latency signal ALi according to set additional latency information.

The latency control circuit 290 may receive the write latency signal WLi from the MRS/EMRS circuit 280 and the address signal ADD from the address buffer 220, and control activations of the column address signal CA and the bank address signal BAL according to the write latency signal WLi. The latency control circuit 290 may receive the additional latency signal ALi from the MRS/EMRS circuit 280, and control activations of the column address signal CA and the bank address signal BAL according to the write latency signal WLi and the additional latency signal ALi.

The semiconductor memory device 10 illustrated in FIG. 1 may be applied to a graphic card, according to an exemplary embodiment.

Further, the semiconductor memory device 10 may be applied to various systems such as a digital television, a set-top box, a digital camcorder, a digital versatile disk (DVD) player, a DVD recorder, a personal video recorder (PVR), and the like.

The semiconductor memory device 10 may be configured such that there is constantly maintained a sum of lengths of data lines between activated banks and the peripheral circuit 16. However, the inventive concept is not limited thereto. For example, the semiconductor memory device 10 may be configured such that there is constantly maintained a sum of physical lengths between activated banks and a peripheral circuit 16. In particular, the semiconductor memory device 10 may be configured such that there is constantly maintained a sum of lengths between activated banks and an internal power supply circuit (not shown) of the peripheral circuit 16.

Figure 8:
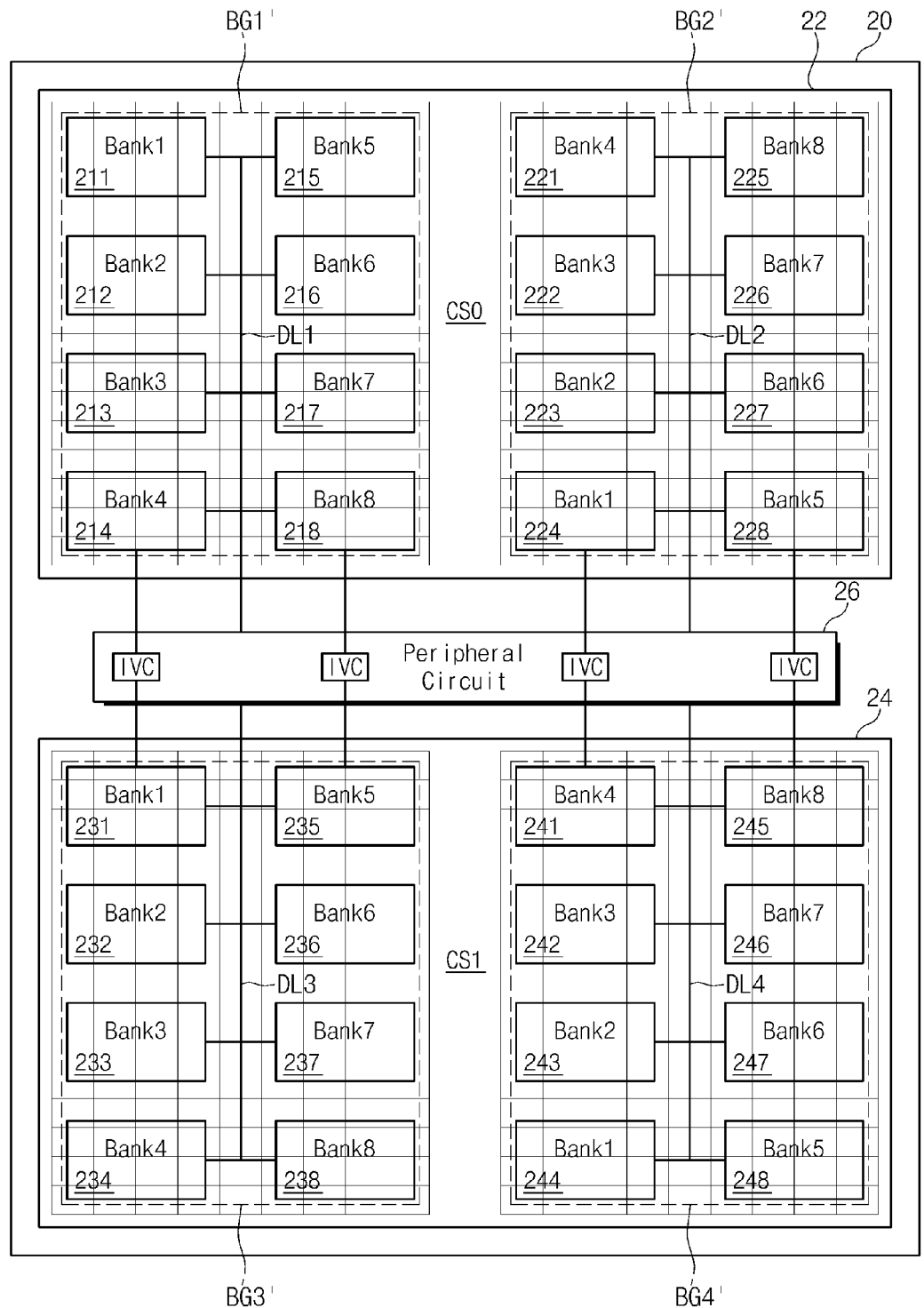
FIG. 8 is a diagram illustrating a semiconductor memory device according to an exemplary embodiment.

FIG. 8 is a diagram illustrating a semiconductor memory device according to an exemplary embodiment.

Referring to FIG. 8, a semiconductor memory device 20 may include four bank groups BG1'-BG4' which are supplied with a power supply voltage via mesh lines connected with internal power supply circuits IVC of a peripheral circuit 26. The semiconductor memory device 20 may be configured such that there is constantly maintained (or uniformed) a sum of lengths (or power supply paths) between activated banks and the internal power supply circuits IVC of the peripheral circuit 26.

For example, a sum of a length between a first bank 211 of the first bank group BG1' and a first internal power supply circuit IVC and a length between a first bank 224 of the second bank group BG2' and a second internal power supply circuit IVC may be identical (or, similar) to a sum of a length between a third bank 213 of the first bank group BG1' and a third internal power supply circuit IVC and a length between a third bank 222 of the second bank group BG2' and a fourth internal power supply circuit IVC.

It is well understood that the semiconductor memory device 20 may be configured to have a same bank architecture as illustrated in FIG. 1. The semiconductor memory device 20 may be configured such that there is constantly maintained a sum of data line lengths between activated banks and the peripheral circuit 26. Although not illustrated in figures, data lines may be arranged such that a data line length between a peripheral circuit and each of the banks in the first to fourth bank groups BG1'-BG4' is maintained identically. This enables data skew owing to a difference between data line lengths to be reduced.

As described above, the semiconductor memory device may have a constant AC characteristic by maintaining constant power consumption when banks of the semiconductor memory device are activated.

Figure 9:
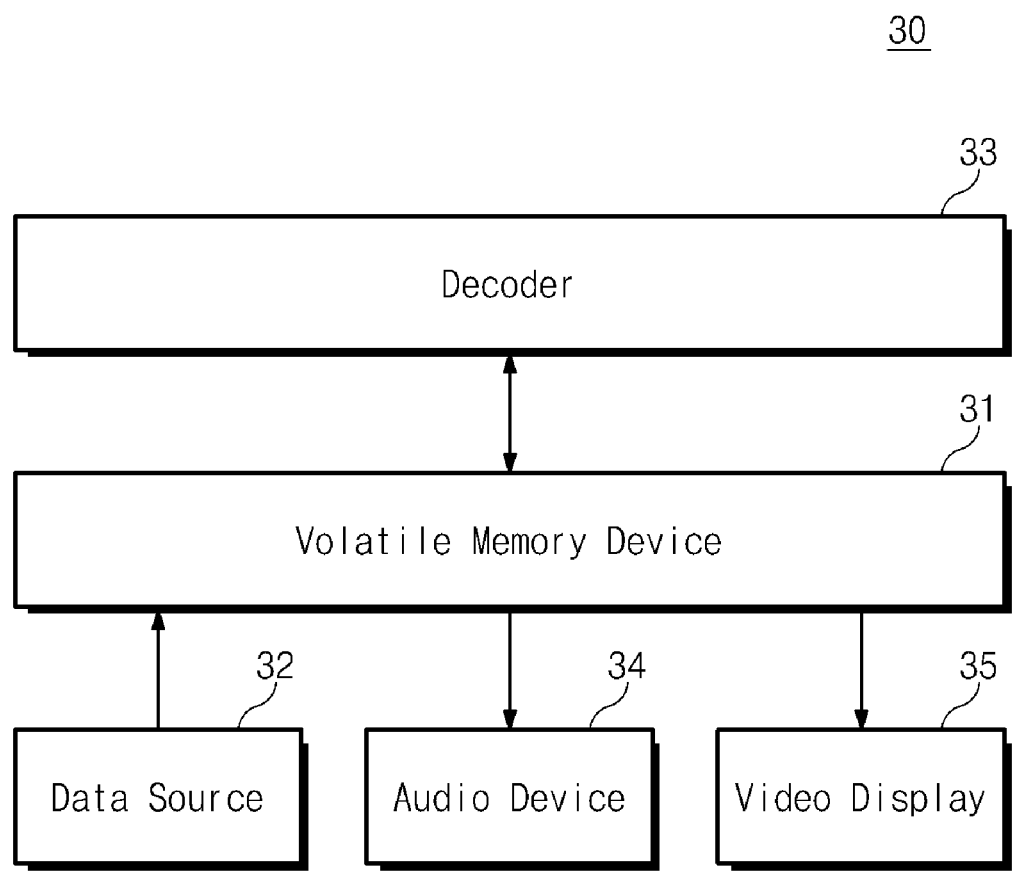
FIG. 9 is a block diagram illustrating a digital television including a semiconductor memory device according to an exemplary embodiment.

FIG. 9 is a block diagram illustrating a digital television including a semiconductor memory device according to an exemplary embodiment. Referring to FIG. 9, a digital television 30 may include a volatile memory device 31, a data source 32, a decoder 33, an audio device 34, and a video display 35.

Although not illustrated in FIG. 9, the volatile memory device 31 may include a bit buffer, a bit buffer/bank, an audio data buffer, a video data buffer, and the like, which may include the same configuration as the semiconductor memory device 10 illustrated in FIG. 1.

The data source 32 may transfer compressed original data to the bit buffer of the volatile memory device 31 which temporarily stores compressed data. In general, signals indicating compressed data may be transmitted via a cable or radio frequency (RF) waves. The data source 32 may include a tuner or a circuit which receives a signal and generates original data with a compression format used at the digital television 30. In general, the data source 32 may provide a high data bandwidth by recording original data streams at continuous addresses corresponding to the bit buffer/bank of the volatile memory device 31 such that page hit is generated at most write operations.

The decoder 33 may perform an operation needed to decode original data output from the bit buffer. During decoding, the decoder 33 may use a decoding buffer (not shown) of the volatile memory device 31 to adjust stored and decoded data into preferable image sizes.

For example, the decoder 33 may be an MPGE-4 decoder. The decoding buffer may store decoded audio and video data in audio and video data buffers (not shown) of the volatile memory device 31. In general, the audio data buffer may necessitate a DRAM with a storage capacity of about 1 Mb, and the video data buffer may necessitate a DRAM with a storage capacity of 16 Mb to 32 Mb according to a screen size of the digital television 30.

The audio device 34 may sound in response to audio data from the audio buffer of the volatile memory device 31. The video display 35 may include circuits which generate images to be displayed using video data from the video buffer of the volatile memory device 31 or a related art graphic control device.

The above-disclosed subject matter is to be considered illustrative, and not restrictive, and the appended claims are intended to cover all such modifications, enhancements, and other exemplary embodiments, which fall within the true spirit and scope. Thus, to the maximum extent allowed by law, the scope is to be determined by the broadest permissible interpretation of the following claims and their equivalents, and shall not be restricted or limited by the foregoing detailed description.

What is claimed is:
1. A semiconductor memory device comprising:
a plurality of banks;
a peripheral circuit configured to send data to and receive data from the plurality of banks; and data lines configured to connect the plurality of banks and the peripheral circuit, wherein the plurality of banks are disposed such that a sum of lengths data transfer paths of the data lines connecting the peripheral circuit and at least two banks, among the plurality of banks, activated at a same time is uniformly maintained.

2. The semiconductor memory device of claim 1, wherein a sum of lengths of data transfer paths of the data lines connecting the peripheral circuit and at least first and second banks, among the plurality of banks, simultaneously activated at a first time point, and a sum of lengths of data transfer paths of data lines connecting the peripheral circuit and at least third and fourth banks, among the plurality of banks, simultaneously activated at a second time point are substantially same.

3. The semiconductor memory device of claim 1, wherein the peripheral circuit comprises a plurality of internal power supply circuits for supplying power to the plurality of banks via meshed lines, and wherein a sum of lengths of power supply paths between the plurality of internal power supply circuits and the at least two activated banks is uniformly maintained.

4. The semiconductor memory device of claim 3, wherein a sum of lengths of power supply paths between at least first and second banks, among the plurality of banks, simultaneously activated at a first time point and corresponding internal power supply circuits of the plurality of power supply circuits, and a sum of lengths of power supply paths between at least third and fourth banks, among the plurality of banks, simultaneously activated at a second time point and corresponding internal power supply circuits of the plurality of power supply circuits are substantially same.

5. A semiconductor memory device comprising:
at least two chips, each chip comprising a plurality of bank groups, each comprising a plurality of banks, and configured to activate at least two banks of the plurality of banks at a same time in response to an input address; and
a peripheral circuit disposed between the at least two chips and configured to interface data via data lines shared by the plurality of bank groups of the at least two chips,
wherein the at least two chips are driven independently, and
wherein when at least two banks in at least one of the at least two chips are activated, a sum of lengths of data transfer paths of data lines between the peripheral circuit and the activated banks is maintained to be constant.

6. The semiconductor memory device of claim 5, wherein a sum of lengths of data transfer paths of data lines connecting the peripheral circuit and at least first and second banks, of a first chip of the at least two chips, simultaneously activated at a first time point, and a sum of lengths of data transfer paths of data lines connecting the peripheral circuit and at least third and fourth banks, of a second chip of the at least two chips, simultaneously activated at a second time point are substantially same.

7. The semiconductor memory device of claim 6, wherein the first chip and the second chip are a same chip or different chips.

8. The semiconductor memory device of claim 5, wherein driving the at least two chips is determined according to a chip select signal.

9. The semiconductor memory device of claim 5, wherein driving the at least two chips is determined according to an input address.

10. The semiconductor memory device of claim 9, wherein the at least two chips comprise first and second chips, wherein the first chip comprises a first bank group comprising eight banks and a second bank group comprising eight banks, and the second chip comprises a third bank group comprising eight banks and a fourth bank group comprising eight banks, and wherein one of the eight banks in the first bank group and one of the eight banks in the second bank group are simultaneously activated by the input address, and one of the eight banks in the third bank group and one of the eight banks in the fourth bank group are simultaneously activated by the input address.

11. The semiconductor memory device of claim 9, wherein the at least two chips comprises first and second chips, wherein the first chip comprises a first bank group comprising eight banks and a second bank group comprising eight banks, and the second chip comprises a third bank group comprising eight banks and a fourth bank group comprising eight banks, and wherein one of the eight banks in the first bank group and one of the eight banks in the second bank group are simultaneously activated by the input address, and the second chip is not driven by the input address.

12. The semiconductor memory device of claim 11, wherein the data lines comprise first data lines, second data lines, third data lines, and fourth data lines, wherein the eight banks of the first bank group are disposed to share the first data lines, four banks being arranged respectively at right and left sides of the first data lines;

wherein the eight banks of the second bank group are disposed to share the second data lines, four banks being arranged respectively at right and left sides of the second data lines;

wherein the eight banks of the third bank group are disposed to share the third data lines, four banks being arranged respectively at right and left sides of the third data lines; and wherein the eight banks of the fourth bank group are disposed to share the fourth data lines, four banks being arranged respectively at right and left sides of the fourth data lines, and wherein the peripheral circuit comprises first input/output pads shared by the first and third data lines and second input/output pads shared by the second and fourth data lines.

13. A semiconductor memory device comprising:
at least two chips, each chip comprising a plurality of bank groups, each comprising a plurality of banks, and configured to activate at least two banks of the plurality of banks at a same time in response to an input address;
a peripheral circuit disposed between the at least two chips and configured to interface data via data lines shared by the plurality of bank groups of the at least two chips,
wherein the peripheral circuit includes at least one internal power supply circuit for supplying power to the banks of the at least two chips,
wherein each of the at least two chips is driven independently, and
wherein when at least two banks in at least one of the at least two chips are activated, a sum of lengths of power supply paths between the peripheral circuit and the activated banks is maintained to be constant.

14. The semiconductor memory device of claim 13, wherein a sum of lengths of power supply paths connecting the peripheral circuit and at least first and second banks, of a first chip of the at least two chips, simultaneously activated at a first time point, and a sum of lengths of power supply paths of data lines connecting the peripheral circuit and at least third and fourth banks, of a second chip of the at least two chips, simultaneously activated at a second time point are substantially same.

15. The semiconductor memory device of claim 14, wherein the first chip and the second chip are a same chip or different chips.

16. The semiconductor memory device of claim 14, wherein the at least first and second banks are connected to different internal power supply circuits of the plurality of internal power supply circuits, and wherein the at least third and fourth banks are connected to different internal power supply circuits of the plurality of internal power supply circuits.

17. The semiconductor memory device of claim 13, wherein when at least two banks in one of the at least two chips are activated, a length of a data transfer path between one of the activated banks and the peripheral circuit is identical to a length of a data transfer path between the other of the activated banks and the peripheral circuit.

* * * * *